(12) United States Patent
Paek et al.

(10) Patent No.: US 8,766,716 B2
(45) Date of Patent: Jul. 1, 2014

(54) APPARATUS AND METHOD FOR INTERLEAVING SWITCHING IN POWER AMPLIFIER

(71) Applicant: Samsung Electronics Co., Ltd., Suwon-si (KR)

(72) Inventors: Ji-Seon Paek, Suwon-si (KR); Dong-Ki Kim, Seoul (KR); Hee-Sang Noh, Yongin-si (KR); Hyung-Sun Lim, Suwon-si (KR); Jun-Seok Yang, Seoul (KR); Young-Eil Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 13/651,941

(22) Filed: Oct. 15, 2012

(65) Prior Publication Data

US 2013/0093521 A1    Apr. 18, 2013

(30) Foreign Application Priority Data

Oct. 14, 2011    (KR) .................. 10-2011-0105566

(51) Int. Cl.
*H03G 3/20*    (2006.01)

(52) U.S. Cl.
USPC .............................. 330/136; 330/297; 330/10

(58) Field of Classification Search
USPC .......................................... 330/297, 10, 136
See application file for complete search history.

(56) References Cited

U.S. PATENT DOCUMENTS

| 6,813,319 | B1 * | 11/2004 | Nagle et al. ................... 375/302 |
| 7,095,277 | B2 * | 8/2006 | Zhou et al. .................... 330/149 |
| 7,679,433 | B1 * | 3/2010 | Li .................................. 330/10 |
| 7,729,445 | B2 * | 6/2010 | Ravi et al. ..................... 375/297 |
| 7,990,214 | B2 * | 8/2011 | Markowski .................... 330/136 |
| 2009/0191826 | A1 | 7/2009 | Takinami et al. |
| 2009/0289720 | A1 | 11/2009 | Takinami et al. |
| 2013/0057240 | A1 * | 3/2013 | Zambetti et al. ............... 323/271 |

* cited by examiner

*Primary Examiner* — Patricia Nguyen
(74) *Attorney, Agent, or Firm* — Jefferson IP Law, LLP

(57) ABSTRACT

An apparatus of a hybrid power modulator using interleaving switching is provided. The apparatus includes a linear switching unit for generating an output signal by comparing an envelope input signal and a feedback signal, an interleaving signal generator for generating an interleaving switching signal arranged not to supply the signal to input stages of P-type Metal-Oxide-Semiconductor (MOS) Field Effect Transistors (FETs) and N-type MOS FETs of power cells at the same time by comparing the output signal and a reference signal, and a switching amplifying unit for determining a level of the switching signal using the interleaving switching signal. Hence, the hybrid power modulator using the interleaving switching method in the envelope signal of the wide bandwidth maintains high efficiency and high linearity. In addition, the buck converter can use the single inductor by preventing the simultaneous on/off of the power cells.

27 Claims, 13 Drawing Sheets

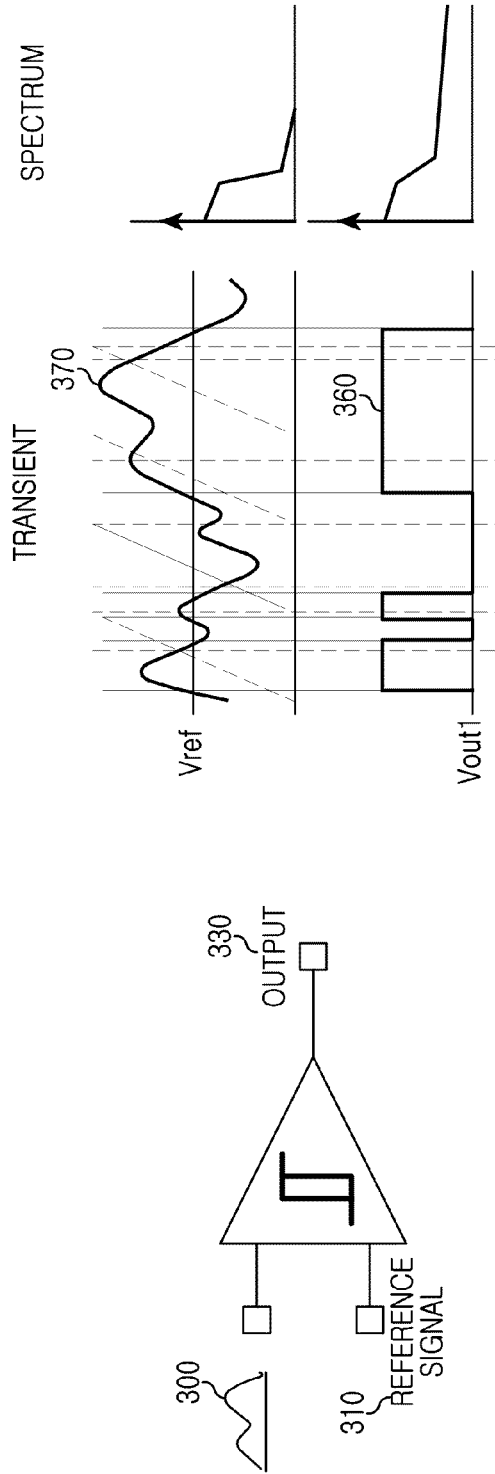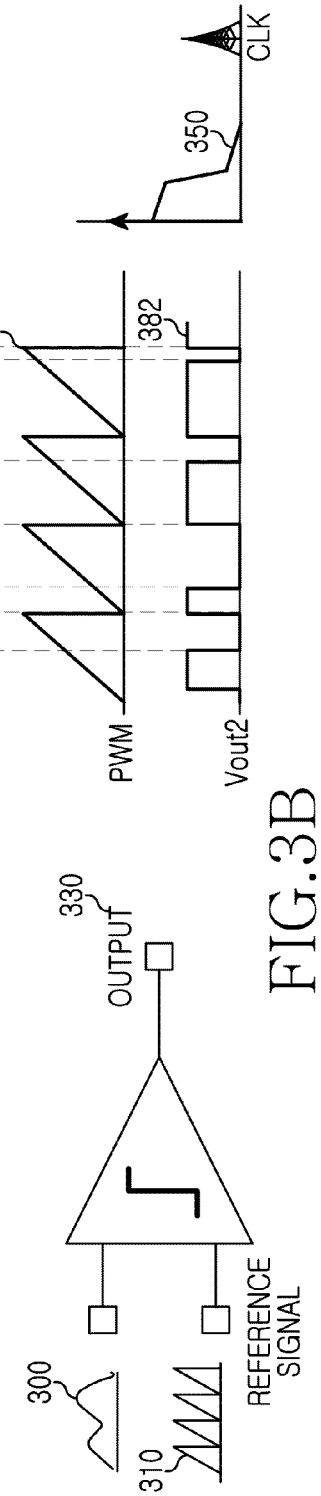
FIG.3A (RELATED ART)
FIG.3B (RELATED ART)

APPARATUS AND METHOD FOR INTERLEAVING SWITCHING IN POWER AMPLIFIER

PRIORITY

This application claims the benefit under 35 U.S.C. §119 (a) of a Korean patent application filed on Oct. 14, 2011 in the Korean Intellectual Property Office and assigned Serial No. 10-2011-0105566, the entire disclosure of which is hereby incorporated by reference.

BACKGROUND OF THE INVENTION

1. Field of the Invention

The present invention relates to an apparatus and a method for interleaving switching for a hybrid power modulator which modulates a supply voltage of a power amplifier according to an envelope of an input Radio Frequency (RF) signal in a radio transmitter.

2. Description of the Related Art

Wireless mobile communication terminals require power management integrated circuit development and wireless power amplifier efficiency increase for the sake of long battery lifetime. In a WirelssBroadband (WiBro) system and a Long Term Evolution (LTE) system, wireless mobile communication terminals require a technique for attaining high efficiency characteristics even with a high Peak-to-Average Power Ratio (PAPR). To address this issue, representative techniques such as Envelope Tracking (ET) or Envelope Elimination & Restoration (EER) may be used. These techniques change the supply voltage of a Radio Frequency (RF) power amplifier according to the output power and constantly operate the RF power amplifier in a saturated region or a switching region to simultaneously achieve high linearity and high efficiency. More particularly, the RF linear amplifier can attain high efficiency even with a modulation signal having a high PAPR.

FIG. 1 illustrates an envelope tracking power amplifier according to the related art.

Referring to FIG. 1, a modem 100 processes a baseband signal in conformity with a corresponding communication scheme (e.g., Orthogonal Frequency Division Multiplexing (OFDM)/Orthogonal Frequency Division Multiple Access (OFDMA) communication scheme or Code Division Multiple Access (CDMA) communication scheme) and outputs the baseband signal to an RF module 102. The modem 100 also provides an envelope component of the baseband signal to a power modulator 106. The RF module 102 converts the baseband signal to an RF signal and outputs the RF signal to an RF power amplifier 104.

According to an envelope signal provided from the modem 100, the power modulator 106 modulates direct-current power (e.g., battery power) and outputs alternating-current power. The output signal of the power modulator 106 is used as a power source, thus achieving optimal linearity and efficiency.

The RF power amplifier 104 amplifies the RF signal according to the output signal of the power modulator 106 and outputs the amplified RF signal over an antenna.

FIG. 2 illustrates a hybrid power modulator for an envelope power amplifier according to the related art.

Referring to FIG. 2, a modem 200, an RF module 202, and an RF power amplifier 205 are substantially the same as the modem 100, the RF module 102, and the RF power amplifier 104 of FIG. 1, and thus their explanations shall be omitted here.

The RF power amplifier 205 uses a hybrid power modulator 204 including a linear amplifying unit and a switching amplifying unit. Most current flowing through the RF power amplifier 205 is supplied by the switching amplifying unit of the power modulator. When the output signal (hereinafter, referred to as a switching current) of the switching amplifying unit passes through an inductor 208, the linear amplifying unit pushes and pulls a compensation current in order to compensate for linearity distortion caused by ripple characteristics of the switching current. For example, the linear amplifying unit pushes the current to the output signal of the switching amplifying unit when the output signal of the switching amplifying unit is small, and pulls the current from the output signal of the switching amplifying unit when the output signal of the switching amplifying unit is great. A buck converter is generally used in the switching amplifying unit of the hybrid power modulator 204.

Typically, the linear amplifying unit includes a linear amplifier 214 and feedback resistors 210 and 212. The switching amplifying unit includes a comparator 216 for generating the switching signal, and a switching amplifier 218 for changing the switching signal of the comparator 216 to an ideal voltage or current level.

The switching signal in the hybrid power modulator 204 is compared with a reference signal by receiving the output signal fed back from the switching amplifying unit, to thus maintain the ideal output voltage. The comparator 216 for generating the switching signal, and the input signal and the reference signal of the comparator 216 determine characteristics of the switching signal. The frequency of the switching signal determines loss characteristics and ripple frequency characteristics of the buck converter. A comparator circuit of the related art includes a hysteretic comparator or a comparator which uses a Pulse Width Modulation (PWM) signal as the reference signal.

FIGS. 3A and 3B illustrate output signals and spectrums of a hysteretic comparator and a comparator that uses a PWM signal as a reference signal, which are used in a switching amplifying unit, according to the related art.

Referring to FIGS. 3A and 3B, the output switching signal 330 of a hysteretic comparator having one comparison phase of the reference signal maintains a certain output level when the input envelope signal 300 is greater than the reference signal 310, and produces the output level of zero when the input envelope signal 300 is smaller than the reference signal 310. The spectral properties 370 of the output switching signal 330 exhibit switching noise throughout a wider frequency band than the spectral properties 360 of the input envelope signal.

By contrast, the switching signal 350 generated using the PWM signal 340 as the reference signal is similar to the spectral properties of the input envelope signal and generates ripple noise power 382 intensively in a cycle frequency of the PWM signal which is used as the reference signal. The cycle frequency of the PWM signal 340 is mostly set to more than two times the input signal band. As the cycle frequency rises, the ripple frequency increases and the ripple noise level reduces. However, the switching loss increases to deteriorate the efficiency of the buck converter.

The integrated circuit for the hybrid power modulator of the wireless terminal is generally designed using Complementary Metal-Oxide Semiconductor (CMOS) process. Typically, a transistor used as the switch of the buck converter includes one power cell including one P-type Metal-Oxide-Semiconductor (MOS) Field Effect Transistor (FET) and one N-type MOS FET. Mostly, the buck converter uses a multiphase switching signal which reduces the ripple noise or shifts the switching frequency into the high frequency without the switching loss.

FIG. 4 illustrates a multiphase switching scheme according to the related art.

Referring to FIG. 4, the buck converter using the multiphase switching signal requires power cells including P-type MOS FET and N-type MOS FETs, and external inductors as many as the multiphase signals. For example, to generate N-ary phase signals, the buck converter needs N-ary MOS FETs, N-ary N-type MOS FETs, and N-ary inductors.

FIG. 5 illustrates a ripple noise reduction of a multiphase switching signal according to the related art.

Referring to FIG. 5, in the buck converter using the multiphase switching signal, the ripple noise frequency exhibits in the N-time frequency, the ripple noise frequency 4fCLK exhibits in the 4-time frequency by adding the ripple noise frequency 500 in the N-time frequency when the phase is zero degree, the ripple noise frequency 510 in the N-time frequency when the phase is 90 degrees, the ripple noise frequency 520 in the N-time frequency when the phase is 180 degrees, and the ripple noise frequency 530 in the N-time frequency when the phase is 270 degrees, and other ripple noise frequencies 1fCLK, 2fCLK, and 3fCLK are reduced.

A DC-DC conversion circuit implemented using the integrated circuit through the CMOS process includes the P-type MOS FET and the N-type MOS FET for fulfilling DC-DC conversion through switching regulation of the battery current. In the DC-DC conversion, the loss in the P-type MOS FET and the N-type MOS FET includes largely two types. One is switching loss due to the switching frequency and the parasitic capacitance, and the other is conduction loss due to on-resistance of the transistor of the P-type MOS FET and the N-type MOS FET. As the switching frequency rises and the parasitic capacitance increases, the switching loss increases.

The buck converter used in the hybrid power modulator of the related art can increase the frequency of the ripple signal by raising the frequency of the switching signal and shift the ripple noise into the intended band. In a system demanding a high data transfer rate, a high switching frequency is required to process the signal in the wide frequency band. However, the high switching frequency deteriorates the efficiency of the buck converter because of the switching loss. In addition, on account of low resistance of the CMOS substrate, the output pulse signal of the buck converter is leaked to cause considerable noise. The considerable noise caused by the buck converter directly affects a Radio Frequency Integrated Circuit (RFIC) and a Power Amplifier Module (PAM) using the power management IC or the hybrid power modulator so as to increase the system noise. Hence, the switching scheme of the related art hardly satisfies both of the high efficiency and the high frequency.

The multiphase switching method of FIG. 4, which is one method of increasing the frequency of the ripple signal and reducing the ripple noise without additional switching loss, requires the power cells including the N-type MOS FETs and the P-type MOS FETs, and the inductors as many as the multiple phases. The great number of the power cells increases the chip area, and the great number of the inductors increases the packaged chip size. As a result, the number of the external passive elements increases and the chip price rises. Naturally, the use of the multiphase switching scheme is restricted.

Due to the limited switching frequency use, it is difficult to design a high-efficiency hybrid power modulator for envelope modulation of a wide bandwidth. Since the noise component of the switching unit of the hybrid power modulator increases, the noise increases in the receiver band to thus degrade the reception of the receiver.

When the limited switching frequency is used, the linear amplifier should provide the push/pull currents for absorbing the ripple noise and provide the current dependent on the input signal in order to compensate for the signal of the wide bandwidth. Accordingly, the role of the linear amplifier having the relative low efficiency grows, and the great sink current provided from the output stage of the linear amplifier causes the power loss at the same time.

It is not easy to control the frequency of the switching signal according to the PWM or hysteretic scheme of the related art. Hence, in the system which changes the channel width based on the status of the multiband communication or the user, the fixed switching frequency or the unpredictable switching frequency can affect the receiver noise.

Therefore, a need exists for an apparatus and a method for reducing the efficiency decrease and the switching ripple noise due to the switching frequency increase, and for increasing the ripple frequency.

The above information is presented as background information only to assist with an understanding of the present disclosure. No determination has been made, and no assertion is made, as to whether any of the above might be applicable as prior art with regard to the present invention.

SUMMARY OF THE INVENTION

Aspects of the present invention are to address the above-mentioned problems and/or disadvantages and to provide at least the advantages described below. Accordingly, an aspect of the present invention is to provide an apparatus and a method for interleaving switching to drive a buck converter of a hybrid power modulator in a power amplifier.

Another aspect of the present invention is to provide an apparatus and a method for reducing several inductors to the single inductor by applying an interleaved switching signal.

Yet another aspect of the present invention is to provide an apparatus and a method for reducing efficiency decrease and switching ripple noise due to switching frequency increase, and increasing a ripple frequency using an interleaving switching scheme.

In accordance with an aspect of the present invention, an apparatus of a hybrid power modulator using interleaving switching is provided. The apparatus includes a linear switching unit for generating an output signal by comparing an envelope input signal and a feedback signal, an interleaving signal generator for generating an interleaving switching signal by comparing the output signal and a reference signal, and a switching amplifying unit for determining a level of the switching signal using the interleaving switching signal. The switching amplifying unit comprises a plurality of power cells which comprise P-type Metal-Oxide-Semiconductor (MOS) Field Effect Transistors (FETs) and N-type MOS FETs, and the interleaving switching signal is a switching signal arranged not to supply the signal to input stages of the P-type MOS FETs and the N-type MOS FETs of the power cells at the same time.

In accordance with another aspect of the present invention, a method for hybrid power modulation using interleaving switching is provided. The method includes generating an output signal by comparing an envelope input signal and a feedback signal, generating an interleaving switching signal by comparing the output signal and a reference signal, and determining a level of the switching signal using the interleaving switching signal. A switching amplifying unit includes a plurality of power cells which comprise P-type MOS FETs and N-type MOS FETs, and the interleaving switching signal is a switching signal arranged not to supply the signal to input stages of the P-type MOS FETs and the N-type MOS FETs of the power cells at the same time.

In accordance with yet another aspect of the present invention, an apparatus of a transmitter is provided. The apparatus includes a power modulator for generating an interleaving switching signal using a Digital Pulse Width Modulation (DPWM) signal, and a power amplifier for amplifying a Radio Frequency (RF) signal according to an output signal of the power modulator. The interleaving switching signal is a switching signal arranged not to supply the signal to input stages of a plurality of power cells which generates a multiphase switching signal, and the power cell comprises a P-type MOS FET and an N-type MOS FET.

In exemplary embodiments of the present invention, the power modulator comprises an interleaving signal generator and the plurality of power cells, and the interleaving signal generator comprises a plurality of comparators for comparing an input signal and a digital sawtooth signal, which is divided into a plurality of levels during one cycle, and for outputting a comparison result of a plurality of D flip-flops for processing output signals of the comparators according to a master clock and a plurality of tri-state buffers for processing the output signals of the comparators, which are synchronized with the master clock, according to a plurality of ring counter clocks, wherein the output signals of the tri-state buffers are combined to generate a DPWM signal.

In exemplary embodiments of the present invention, the apparatus comprises a demultiplexer for generating a pulse signal by multiplying the DPWM signal by a plurality of first inverse ring counter clocks such that the switching signal is not supplied to the input stages of the P-type MOS FETs and the N-type MOS FETs of the switching amplifying unit at the same time.

In exemplary embodiments of the present invention, the ring counter clocks have the same cycle and different phases, and the cycle is equal to or slower than a cycle of the digital sawtooth signal.

In exemplary embodiments of the present invention, a cycle of the digital sawtooth signal, which is divided into the plurality of the levels, is more than two times faster than the cycle of the output signal.

In exemplary embodiments of the present invention, the plurality of first inverse ring counter clocks is determined based on an average duty ratio of the DPWM signal.

In exemplary embodiments of the present invention, the plurality of first inverse ring counter clocks has different cycles, different phases, and different duty ratios.

In exemplary embodiments of the present invention, the demultiplexer generates the pulse signal by multiplying an inverse signal of the DPWM signal by a plurality of second inverse ring counter clocks such that the switching signal is not supplied to the input stages of the P-type MOS FETs and the N-type MOS FETs of the switching amplifying unit at the same time.

In exemplary embodiments of the present invention, the first inverse ring counter clocks and the second inverse ring counter clocks do not overlap each other.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will be more apparent from the following description taken in conjunction with the accompanying drawings, in which:

FIGS. 3A and 3B illustrate output signals and spectrums of a hysteretic comparator and a comparator which uses a Pulse Width Modulation (PWM) signal as a reference signal, which are used in a switching amplifying unit, according to the related art;

Throughout the drawings, like reference numerals will be understood to refer to like parts, components and structures.

DETAILED DESCRIPTION OF EXEMPLARY EMBODIMENTS

Figure 1:
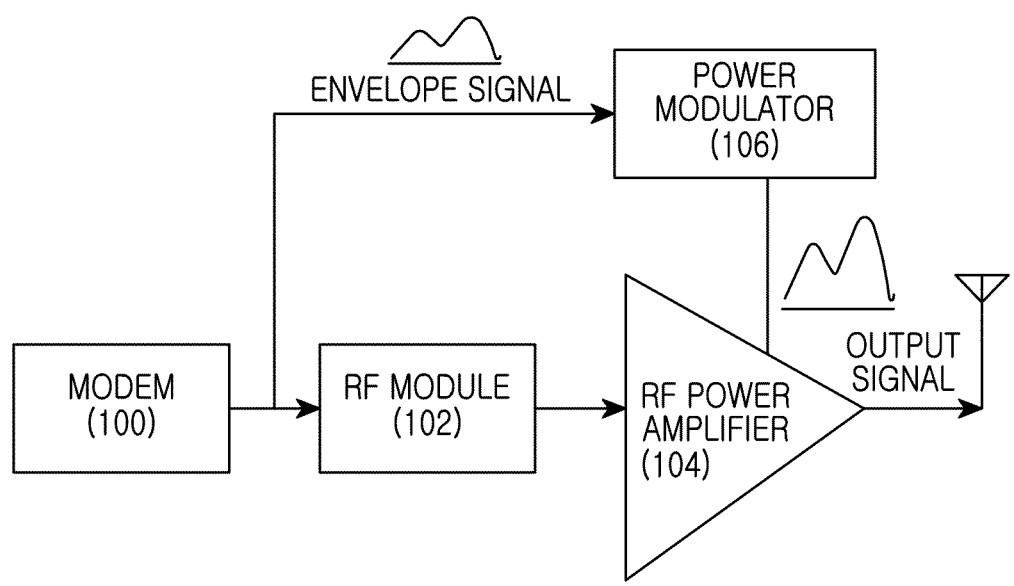
FIG. 1 illustrates an envelope tracking power amplifier according to the related art.
Figure 2:
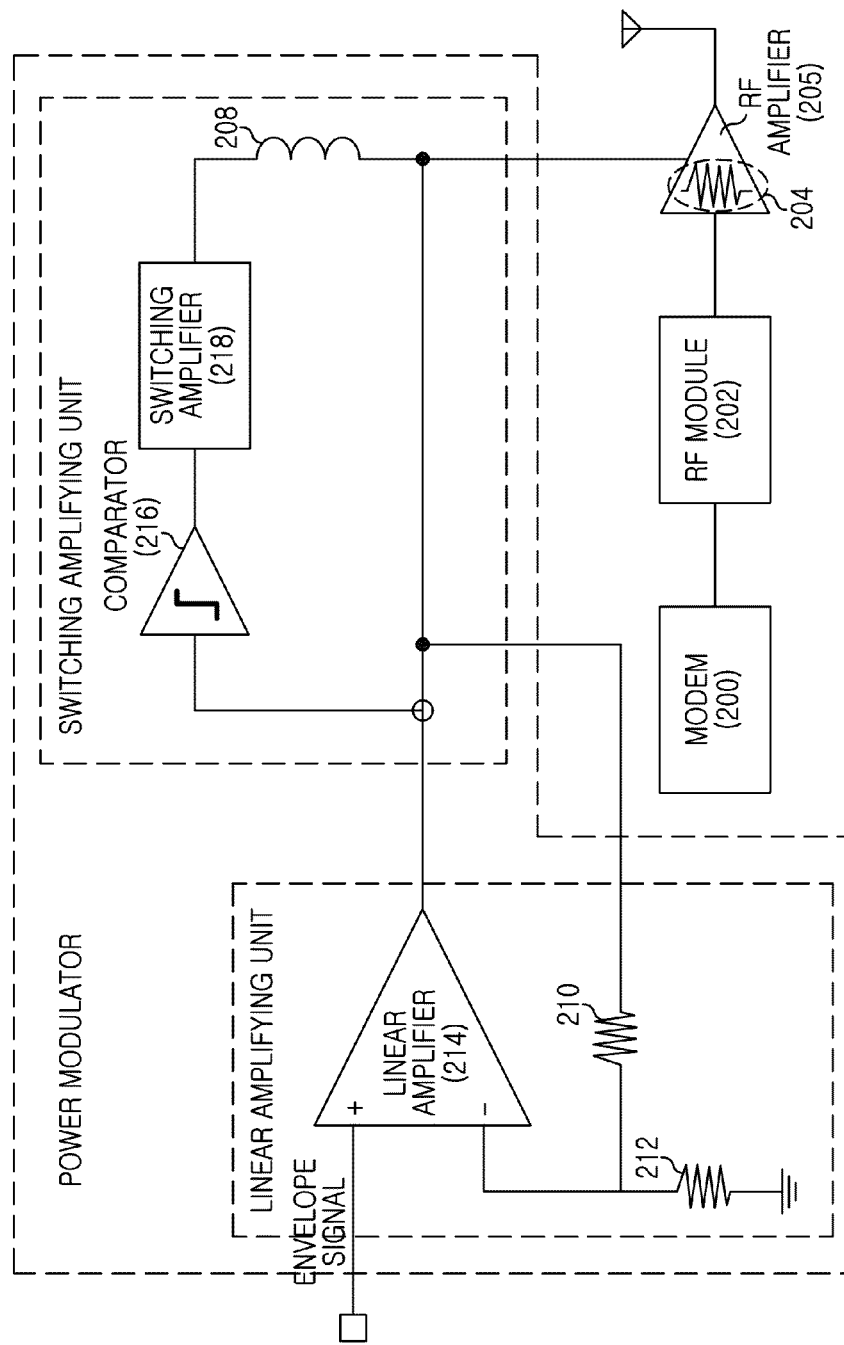
FIG. 2 illustrates a hybrid power modulator for an envelope power amplifier according to the related art.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and words used in the following description and claims are not limited to the bibliographical meanings, but are merely used by the inventor to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

Exemplary embodiments of the present invention relate to an apparatus and a method for interleaving switching for a hybrid power modulator which modulates a supply voltage of a power amplifier according to an envelope of an input Radio Frequency (RF) signal in a radio transmitter.

Exemplary embodiments of the present invention provide an apparatus and a method for interleaving switching in a power amplifier.

FIGS. 1 through 13, discussed below, and the various exemplary embodiments used to describe the principles of the present disclosure in this patent document are by way of illustration only and should not be construed in any way that would limit the scope of the disclosure. Those skilled in the art will understand that the principles of the present disclosure may be implemented in any suitably arranged communications system. The terms used to describe various embodiments are exemplary. It should be understood that these are provided to merely aid the understanding of the description, and that their use and definitions in no way limit the scope of the invention. Terms first, second, and the like are used to differentiate between objects having the same terminology and are in no way intended to represent a chronological order, unless where explicitly stated otherwise. A set is defined as a non-empty set including at least one element.

Figure 6:
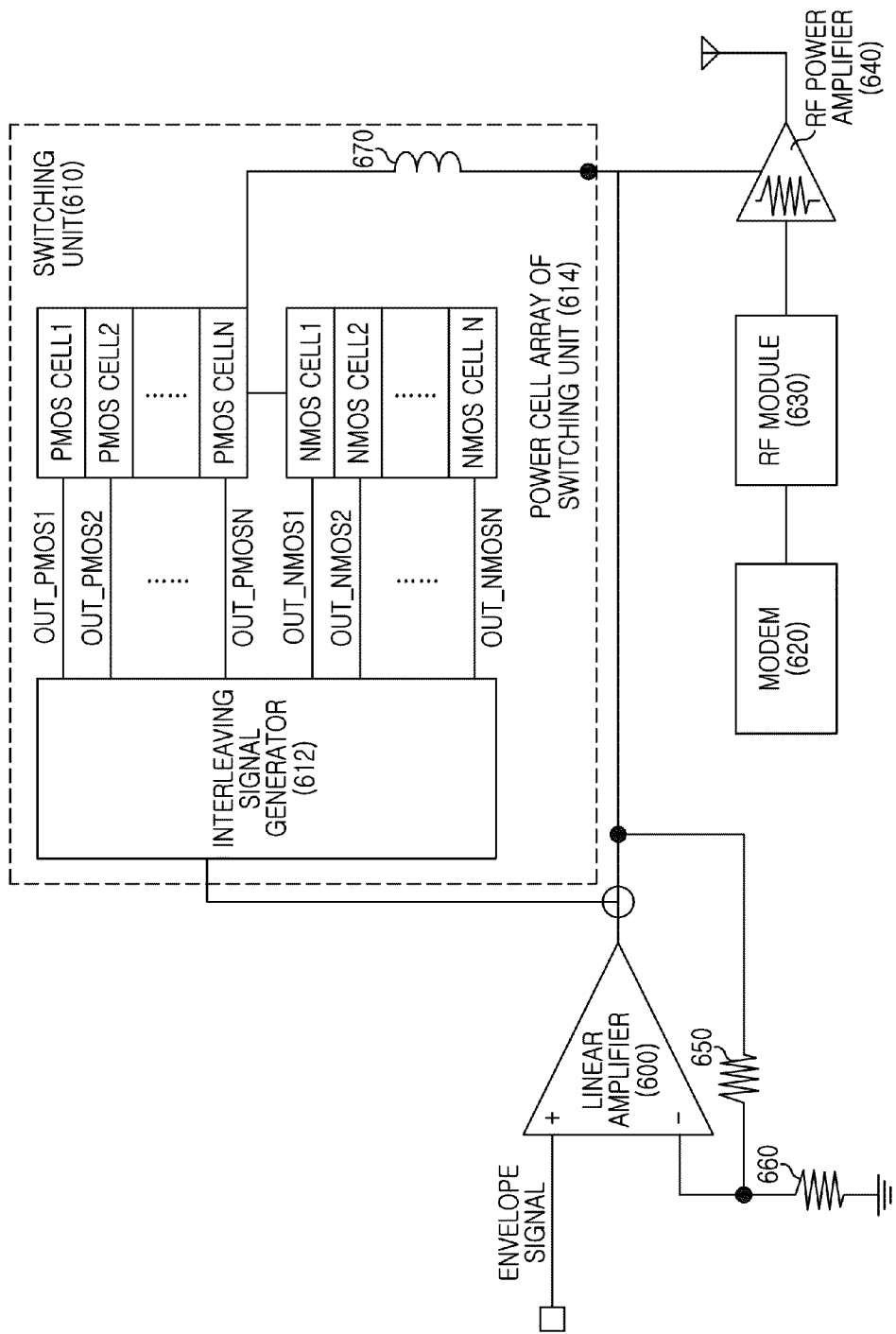
FIG. 6 illustrates a power amplifier including a hybrid power modulator which adopts an interleaving switching scheme in a transmitter according to an exemplary embodiment of the present invention.

FIG. 6 illustrates a power amplifier including a hybrid power modulator which adopts an interleaving switching scheme in a transmitter according to an exemplary embodiment of the present invention.

Referring to FIG. 6, the transmitter includes a linear amplifier 600, a switching amplifying unit 610, a modem 620, a Radio Frequency (RF) module 630, an RF power amplifier 640, and feedback resistances 650 and 660. The switching amplifying unit 610 includes a signal generator 612 for generating an interleaving switching signal and a power cell array 614 of a buck converter. Outside the chip, one inductor 670 supplies current by integrating a pulse signal (e.g., the switching signal) of the buck converter output. The interleaving switching signal generator 612 generates a signal for controlling the power cells. For example, the interleaving switching signal generator 612 generates the interleaving signal such that the input signal is not transferred to a P-type Metal-Oxide-Semiconductor (MOS) Field Effect Transistor (FET) and an N-type MOS FET at the same time, and provides the interleaving signal to the power cell array 614 of the switching unit, which shall be elucidated by referring to FIG. 7.

Herein, a size of the power cell is designed to exhibit an optimal value in the operating frequency. To reduce the switching loss which increases as the frequency increases, a parasitic capacitance value of the power cells needs to be decreased.

The modem 620 processes a baseband signal in conformity with a corresponding communication scheme (e.g., Orthogonal Frequency Division Multiplexing (OFDM)/Orthogonal Frequency Division Multiple Access (OFDMA) communication scheme or Code Division Multiple Access (CDMA) communication scheme), and outputs the baseband signal to the RF module 630. The modem 620 provides the envelope component of the baseband signal to the linear amplifier 600. The RF module 630 converts the baseband signal to an RF signal and outputs the RF signal to the RF power amplifier 640. The RF power amplifier 640 amplifies the RF signal output from the RF module 630, according to the switching signal output from the switching amplifying unit 610, and outputs the amplified RF signal via an antenna.

A basic operation principle of the hybrid power modulator employs a hybrid power modulator including the linear amplifying unit (i.e., including the linear amplifier 600 and the feedback resistances 650 and 660) and the switching amplifying unit 610. Most of the current to the RF power amplifier 640 is supplied by the switching amplifying unit 610. To compensate for linearity distortion caused by ripple characteristics of the switching signal after passing through the inductor 670, the linear amplifying unit compares an envelope input signal and a feedback output signal via the feedback resistances 650 and 660, and pushes and pulls the compensation current. The switching amplifying unit 610 of the hybrid power modulator typically employs a buck converter.

The switching signal for driving the buck converter is generated using a Pulse Width Modulation (PWM) scheme or a hysteresis scheme.

Figure 8A:
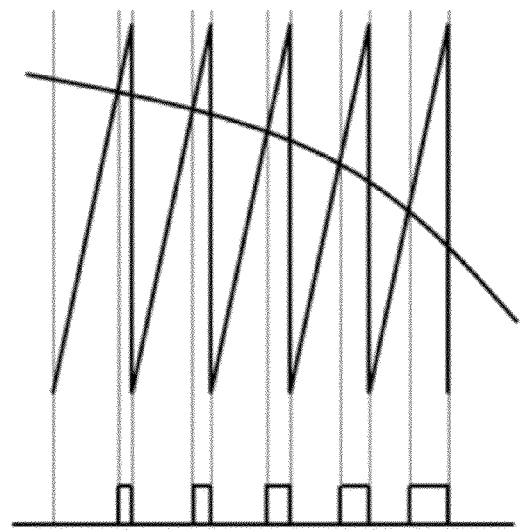
FIGS. 8A through 8C illustrate methods for generating a switching pulse signal to drive a switching amplifying unit of a hybrid power modulator according to exemplary embodiments of the present invention.
Figure 8B:
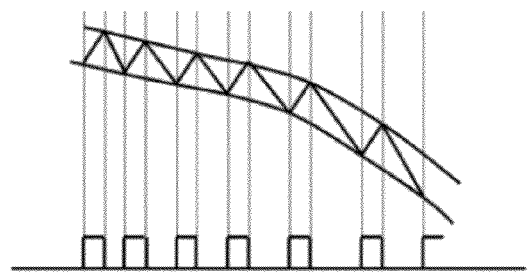
Figure 8C:
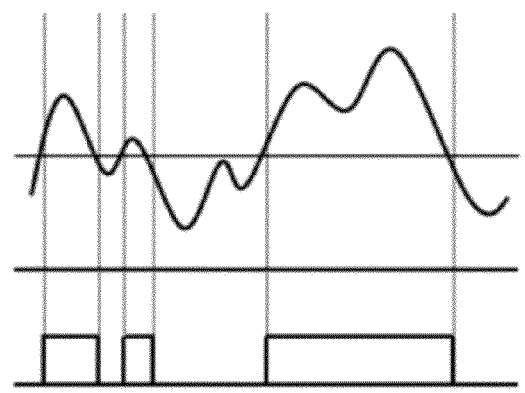

FIGS. 8A through 8C illustrate methods for generating a switching pulse signal to drive the switching amplifying unit of a hybrid power modulator according to exemplary embodiments of the present invention.

Referring to FIG. 8A, to generate the switching pulse signal using the PWM signal, the PWM signal should include frequency components at least more than two times the envelope signal bandwidth. The PWM signal including the sufficiently wide switching frequency includes most of the frequency components of the envelope signal, and the replica of the switching frequency is apart from the frequency band of the intended envelope signal. Hence, the spectral efficiency of the PWM signal in the in-band is equal to the spectral efficiency of the input envelope signal, and indicates the frequency characteristics of the ripple noise.

Referring to FIGS. 8B and 8C, to generate the switching pulse signal using the hysteresis scheme, the small signal or the large signal operates according to the frequency bandwidth of the input envelope signal. When a slew rate of the switching amplifying unit is faster than the slew rate of the output signal, the small signal of FIG. 8B operates and the output signal of the switching amplifying unit follows the input envelope signal. The slew rate indicates the maximum rate of change of the output voltage per time. However, when the slew rate of the switching amplifying unit is slower than the slew rate of the output signal, the switching unit cannot thoroughly follow the output signal and the hysteretic comparator can no longer operate within the range of +/−Vh. Thus, the hysteresis scheme in the input envelope signal including the wide bandwidth operates the large signal. FIG. 8C illustrates the hysteresis scheme in the large signal. To operate the small signal in the input envelope signal of the wide bandwidth, the switching frequency of the hysteretic comparator, like the PWM signal, should be at least more than two times the envelope signal bandwidth. The spectrum of the hysteresis pulse signal in the large signal has quite wide bandwidth, and information of the input envelope signal includes only 1-bit information. Hence, the ripple noise signal is present in the wide frequency band.

The switching frequency of the PWM scheme or the hysteresis scheme for the small signal, for the sake of the hybrid power modulator including the wideband input signal, requires a very high frequency. Using the very high switching frequency, the spectrum of the pulse signal can be the same as the input signal and the ripple noise can be separated from the in-band. However, the high switching frequency degrades the efficiency of the buck converter to deteriorate the efficiency of the hybrid power modulator. In addition, the linear amplifier having very wide Gain Bandwidth Product (GBW) is required to remove the ripple noise signal in the wide frequency band or the high frequency band. The pulse spectrum of the hysteresis scheme for operating the large signal has the very wide bandwidth to generate the ripple noise throughout the wide frequency band. As a result, it is difficult to predict the frequency characteristics for the ripple noise, and leak noise and system noise increase.

Figure 4:
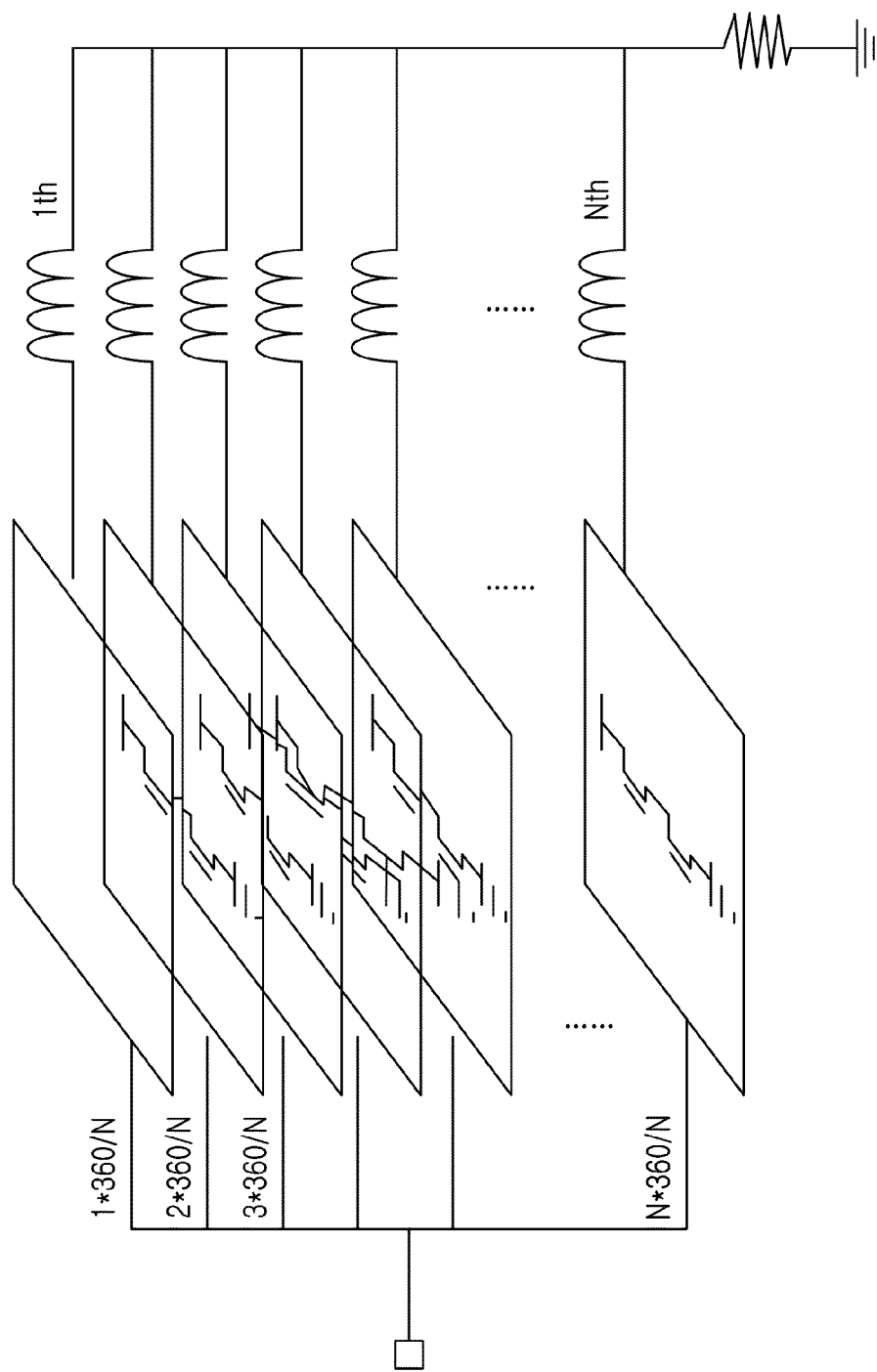
FIG. 4 illustrates a multiphase switching scheme according to the related art.
Figure 5:
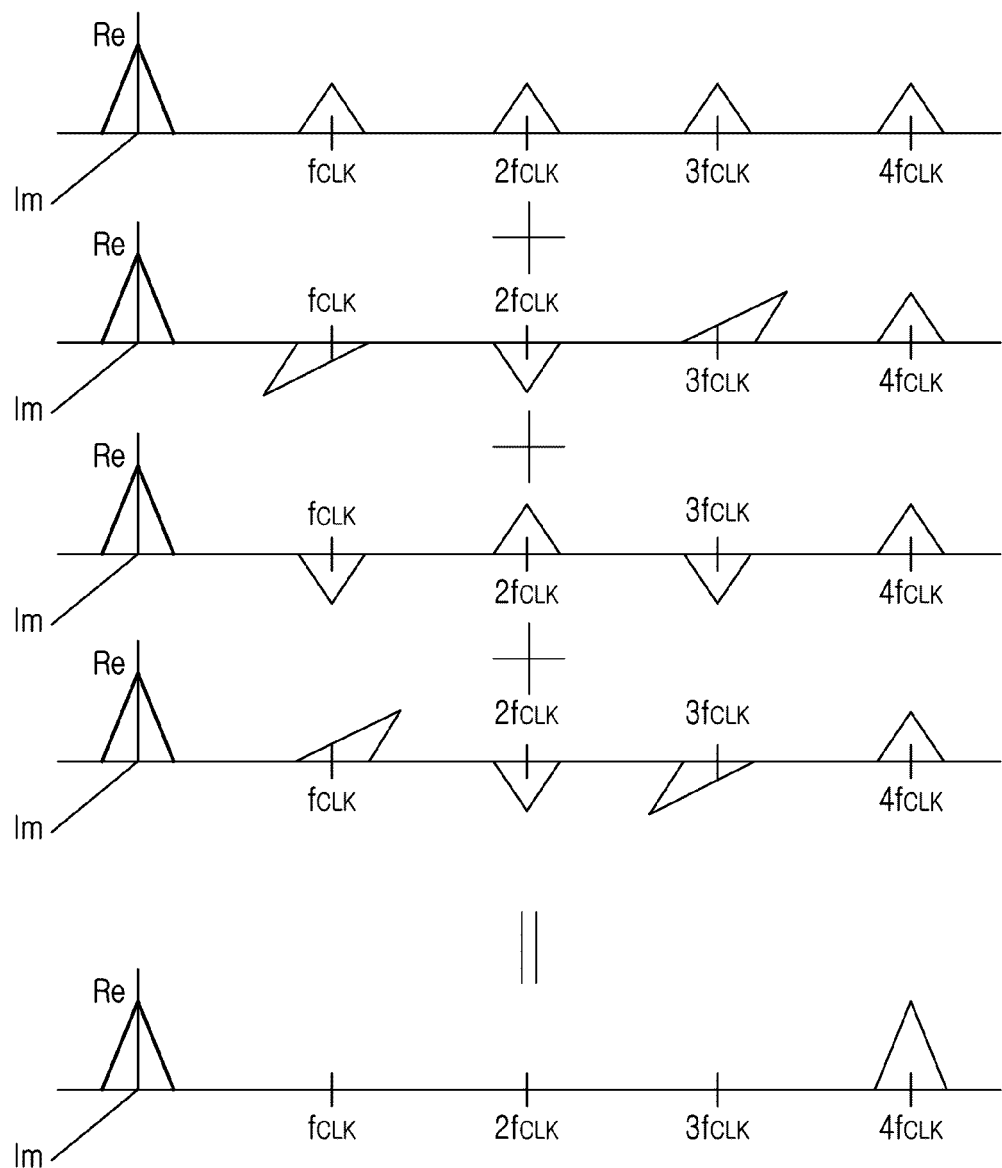
FIG. 5 illustrates a ripple noise reduction of a multiphase switching signal according to the related art.

The multiphase signal can be used to cancel the ripple noise and to increase the frequency of the ripple signal without increasing the switching frequency as shown in FIG. 4. However, the related art uses the several external inductors to use the multiphase signal. An exemplary embodiment of the present invention provides the interleaving switching technique for the hybrid power modulator, which can increase the frequency of the ripple signal using the single external inductor without raising the switching frequency. Since the reference signal of several levels is compared with the input signal, the present interleaving switching signal can contain input information of a large number of bits. Thus, the spectrum of the present interleaving switching signal is similar to the spectrum of the input signal.

Figure 7:
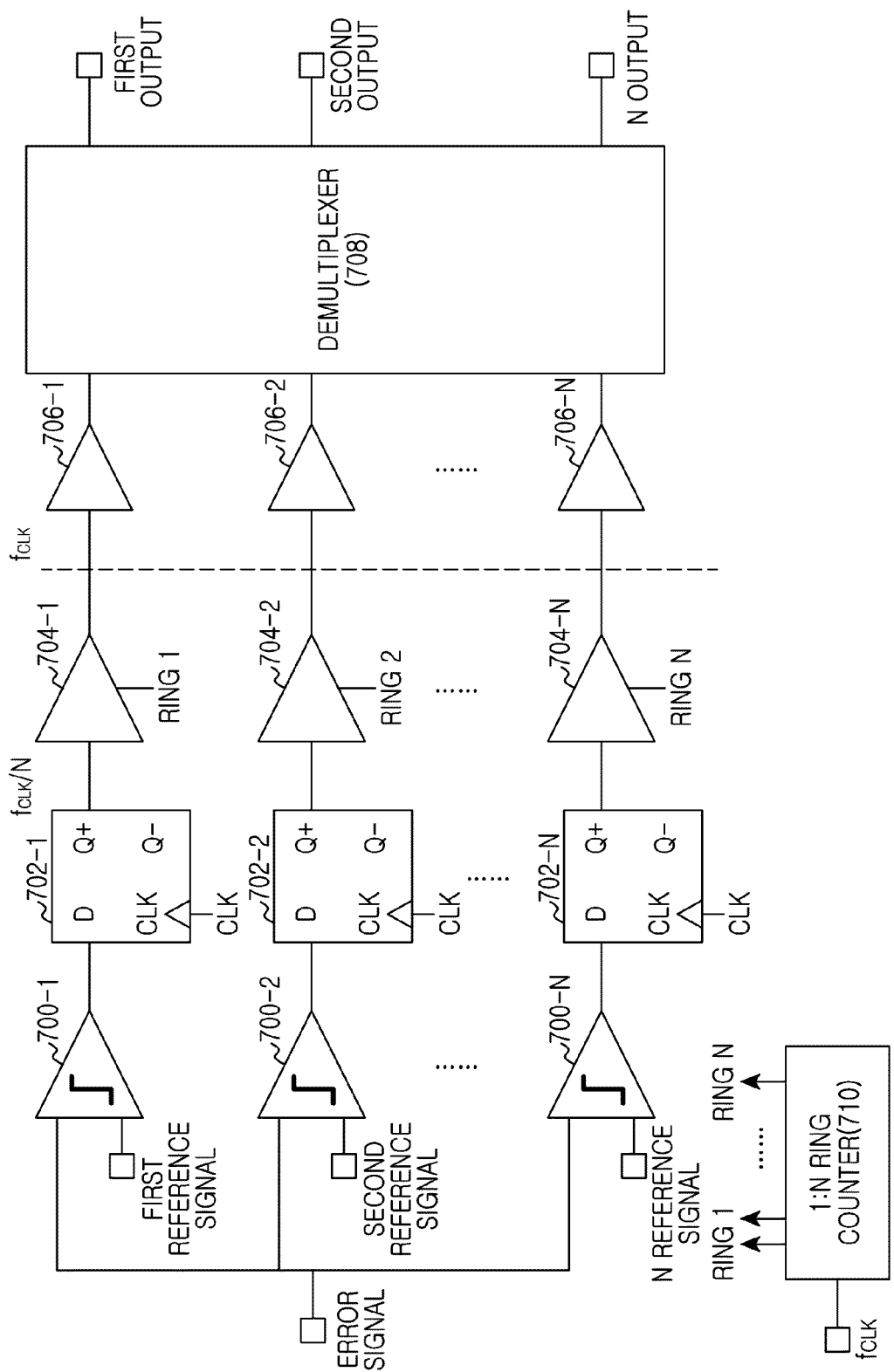
FIG. 7 illustrates an interleaving switching signal generator according to an exemplary embodiment of the present invention.

FIG. 7 illustrates an interleaving switching signal generator according to an exemplary embodiment of the present invention.

Referring to FIG. 7, the interleaving switching signal generator 614 includes a frequency/phase divider (not shown) for dividing a master clock signal, a reference signal generator (not shown), a 1:N ring counter 710, a plurality of comparators 700, a plurality of D flip-flops 702, a plurality of tri-state buffers 704, a plurality of buffers 706, and a demultiplexer 708.

The frequency/phase divider provides the master clock fCLK to the D flip-flops 702. The frequency/phase divider divides and provides the master clock frequency fCLK by 1/N to the tri-state buffers 704 together with the corresponding phases. For example, the first tri-state buffer 704 provides the clock fCLK/N of the zero-degree phase, and the second tri-state buffer 704 provides the clock fCLK/N of the 45-degree phase. Herein, N is an integer. For example, the tri-state buffers 704 have the same clock cycle but different phases.

The frequency/phase divider provides a ring counter signal for converting a Digital Pulse Width Modulation (DPWM) signal to the interleaving switching signal, to the demultiplexer 708.

Figure 9:
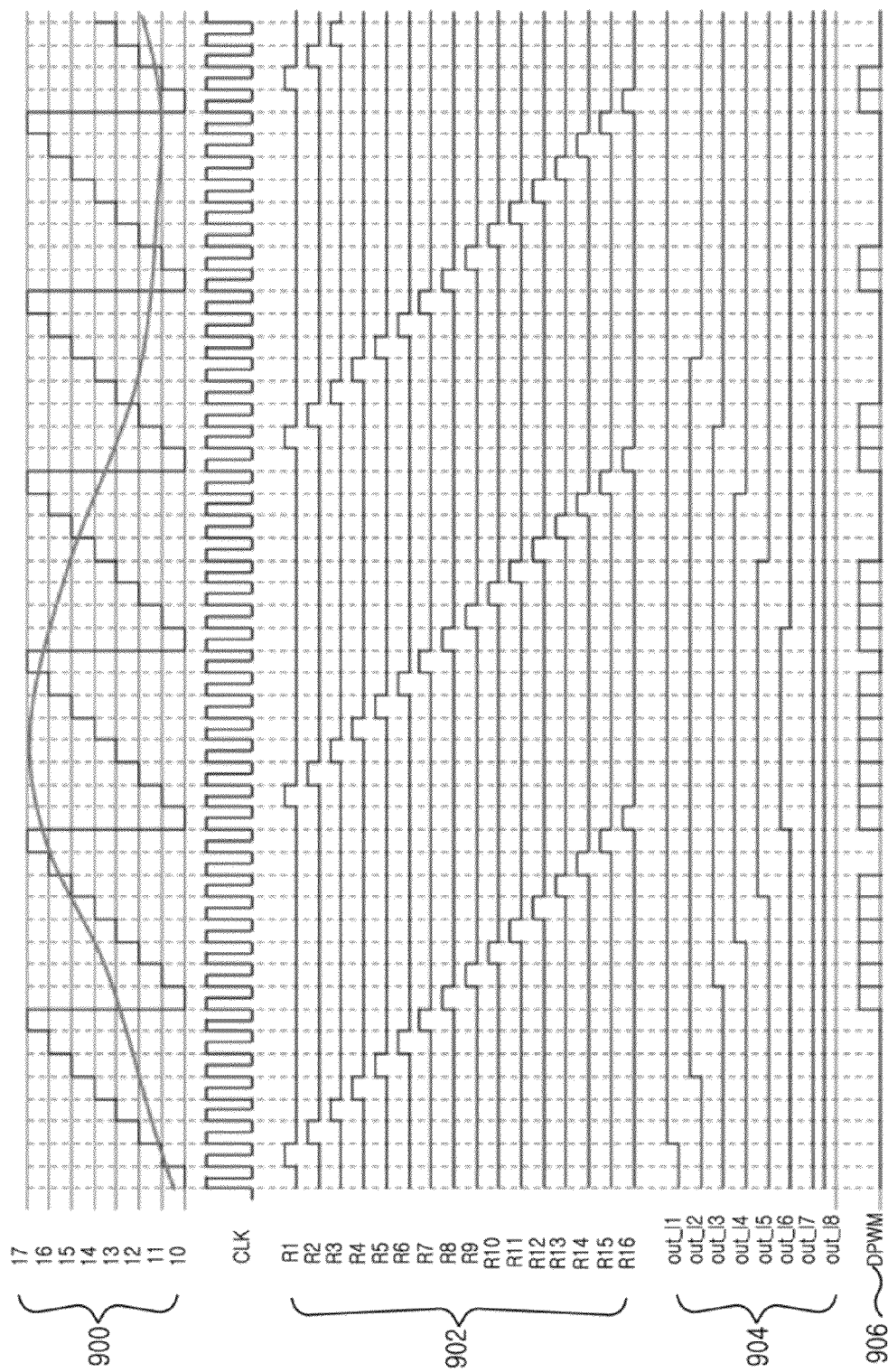
FIG. 9 illustrates a Digital PWM (DPWM) signal generation for an interleaving switching signal according to an exemplary embodiment of the present invention.

The reference signal generator generates and provides a digital sawtooth signal to the input stage of the corresponding comparator 700. The digital sawtooth signal is divided into a plurality of levels to form right-angled triangles in a stepwise manner. For example, the digital sawtooth signal is divided into 8 levels and repeatedly generated based on the 8 master clocks as shown in FIG. 9.

A plurality of level signals for generating one digital sawtooth signal is provided to the input stage of the corresponding comparators 700. For example, eight level signals forming the DPWM signal are provided to eight comparators 700 respectively. The number of comparators 700 is greater than or equal to the number of the levels forming the DPWM signal. For example, when eight levels form the digital sawtooth signal, the number of comparators 700 is greater than eight and is a multiple of 8. Accordingly, when the number of comparators 700 is greater than the number of the levels forming the digital sawtooth signal, the eight level signals of the first digital sawtooth signal are mapped to the eight comparators, and the next eight level signals of the second digital sawtooth signal are mapped to eight other comparators. In other words, the cycle of the digital sawtooth signal is earlier than the clock cycle provided from the ring counter 710 to the tri-state buffers 704.

The numbers of comparators 700, D flip-flops 702, and tri-state buffers 704 are closely related to the clock cycle provided from the 1:N ring counter 710 to the D flip-flop 702.

For example, as the clock cycle provided from the 1:N ring counter 710 to the D flip-flop 702 decreases, the number of comparators 700, D flip-flops 702, and tri-state buffers 704 decreases. As the clock cycle increases, the number of comparators 700, D flip-flops 702, and tri-state buffers 704 increases.

The comparator 700 outputs the switching signal by comparing the signal output from the linear amplifying unit and the reference signal (i.e., the DPWM signal) fed from the reference signal generator.

The D flip-flop 702 receives the switching signal from the comparator 700 and outputs the input switching signal according to the clock signal.

The tri-state buffer 704 processes the output signal from the D flip-flop 702 according to the ring counter clock signal fed from the 1:N ring counter 710.

The buffer 705 buffers the output signal (hereinafter, referred to as the DPWM signal) from the tri-state buffer 704, and provides the signal to the demultiplexer 708.

In short, the DPWM signal is generated through the comparators 700, the D flip-flops 702, and the tri-state buffers 704. The DPWM signal generation is described below with reference to FIG. 9.

The demultiplexer 708 generates the interleaving switching signal using the DPWM signals output through the buffers 706 so that the input signals are not concurrently provided to the P-type MOS FETs and the N-type MOS FETs constructing the power cell array 614 of the switching amplifying unit 610 of FIG. 7. The interleaving switching signal generation using the DPWM signal is described below with reference to FIG. 10.

FIG. 9 illustrates a DPWM signal generation for an interleaving switching signal according to an exemplary embodiment of the present invention.

Referring to FIG. 9, the comparator 700 compares the input signal with the reference signal of the several levels I0 through IN-1, that is, with the digital sawtooth signal in step 900. In FIG. 9, N=8 and the reference signal may be divided into levels greater or smaller than N=8 in various implementations. The output signals 904 Out_I0 through Out_I7 are generated per level in synchronization with the master clock CLK. Herein, the 8-level reference signals I0 through IN-1 are iteratively generated on the 8-clock cycle.

For example, the first comparator compares the first level signal I0 of the reference signal with the input signal, outputs a voltage level Out_I0 when the input signal is greater than the level signal I0 of the reference signal, and does not output the voltage level when the input signal is smaller than the level signal I0 of the reference signal. The second comparator compares the second level signal I1 of the reference signal with the input signal, outputs a voltage level Out_I1 when the input signal is greater than the second level signal I1 of the reference signal, and does not output the voltage level when the input signal is smaller than the second level signal I1 of the reference signal. Similarly, the eighth comparator compares the eighth level signal I7 of the reference signal with the input signal, outputs a voltage level Out_I1 when the input signal is greater than the eighth level signal I7 of the reference signal, and does not output the voltage level when the input signal is smaller than the eighth level signal I7 of the reference signal. Herein, the output signals Out_I0 through Out_I7 contain the information of the input signal. As the number of the levels increases, the information amount of the input signal increases.

The output signals are multiplied by 1:N ring counter signals 902 R0 through RN−1 and added up. In FIG. 9, N=16 and the number of the ring counter signals can be greater than or smaller than N=16 in various implementations. The ring counter signals are generated on the same cycle with different phases.

For example, the eighth ring counter signal R8 and the sixteenth ring counter signal R16 are multiplied by the first output signal Out_I0, the first ring counter signal R1 and the ninth ring counter signal R9 are multiplied by the second output signal Out_I1, the second ring counter signal R2 and the tenth ring counter signal R10 are multiplied by the third output signal Out_I2, the third ring counter signal R3 and the eleventh ring counter signal R11 are multiplied by the fourth output signal Out_I3, the fourth ring counter signal R4 and the twelfth ring counter signal R12 are multiplied by the fifth output signal Out_I4, the fifth ring counter signal R5 and the thirteenth ring counter signal R13 are multiplied by the sixth output signal Out_I5, the sixth ring counter signal R6 and the fourteenth ring counter signal R14 are multiplied by the seventh output signal Out_I6, and the seventh ring counter signal R7 and the fifteenth ring counter signal R15 are multiplied by the eighth output signal Out_I7. The added output signal DPWM 906 represents the On/Off cycle of the P-type MOS FET. The DPWM signal 906 has a resolution of N=8 levels and becomes a discrete PWM signal on the cycle of CLK/N (N=8). The cycle of CLK/N is at least more than two times the bandwidth of the input signal. Hence, the switching frequency of the DPWM signal 906 is still high enough to degrade the efficiency of the buck converter. However, when the DPWM signal 906 is converted to the interleaving switching signal, the frequency of the driving switching signal of the buck converter can be lowered.

Figure 10:
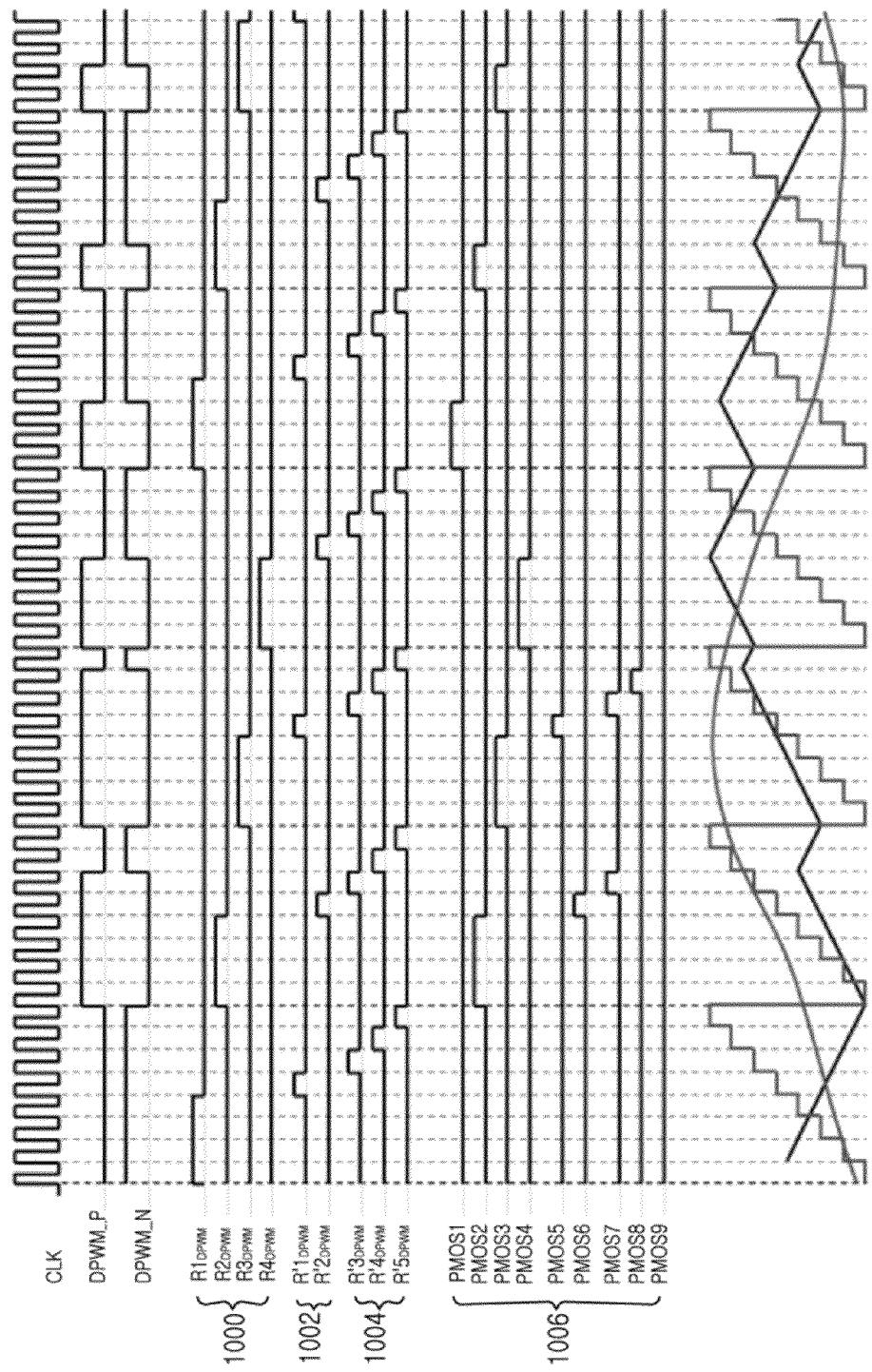
FIG. 10 illustrates an interleaving switching signal generation using a DPWM signal according to an exemplary embodiment of the present invention.

FIG. 10 illustrates an interleaving switching signal generation using a DPWM signal according to an exemplary embodiment of the present invention.

Referring to FIG. 10, a DPWM_P signal is the input to the input stage of the P-type MOS FET, and the DPWM_N signal is the input to the input stage of the N-type MOS FET. Hereinafter, while the DPWM_P signal is converted to the interleaving switching signal by way of example, an exemplary embodiment of the present invention is equally applicable to the conversion of the DPWM_N signal to the interleaving switching signal.

First ring counter signals 1000 and second ring counter signals 1002 and 1004 are defined to convert the DPWM signal to the interleaving switching signal.

The first ring counter signals 1000 R1DPWM through RMDPWM have the cycle of (CLK/N)/M, and the duty ratio indicating the ratio of the pulse repetition interval to the pulse width is D/M %. The CLK is the master clock cycle, N is the cycle of the reference signal (i.e., the digital sawtooth signal) (N=8), and M is the cycle (M=32) shorter than the cycle of the reference signal. D (D=4) is the pulse width during the pulse repetition interval M. For example, the duty ratio D/M of the first ring counter signals 1000 R1DPWM through RMD-PWM is 4/32.

The second ring counter signals 1002 R'1DPWM through R'MDPWM have the cycle of (CLK/N)/K through CLK/N, and the duty ratio is (D/K) %. The CLK is the master clock cycle, N is the cycle of the reference signal (the digital sawtooth signal) (N=8), and K is the cycle (K=16, 8) shorter than the cycle of the reference signal. In the second ring counter signals 1002 R'1DPWM through R'2DPWM, D (D=1) is the pulse width during the pulse repetition interval (K=16). For example, the duty ratio D/K of the second ring counter signals 1002 R'1DPWM through R'2DPWM is 1/16. In the second ring counter signals 1004 R'3DPWM through R'5DPWM, D (D=1) is the pulse width during the pulse repetition interval (K=8). For example, the duty ratio D/K of the second ring counter signals 1004 R'3DPWM through R'5DPWM is 1/8.

Herein, the first ring counter signals 1000 and second ring counter signals 1002 and 1004 become the clock signal for generating the interleaving switching signal. In so doing, the duty ratio of the RMCLK signal has an optimal value on account of the average duty ratio of the DPWM signal. Hence, variables CLK, N, M, D and K can have the optimal point according to the bandwidth of the input signal, the switching frequency of the DPWM, the switching frequency of the interleaving switching signal, and the duty ratio of the interleaving switching signal.

In general, as M increases, the cycle of the interleaving signal is lowered. The low switching frequency improves the efficiency of the buck converter but reduces the duty ratio of the interleaving signal to thus cause the loss in the buck converter. Hence, a first component and a second component are divided based on the average duty ratio of the DPWM signal. The DPWM output signal multiplied by the first ring counter signal generates the first interleaving signal. The first interleaving signal includes most of the power of the DPWM signal, has the low switching speed, and increases the duty ratio. By contrast, the second interleaving signal has the first resolution of the DPWM signal and the high switching speed. In FIG. 10, the first and second interleaving signals 1006 PMOS1 through PMOS9 are generated by multiplying the first ring counter signals 1000 and second ring counter signals 1002 and 1004 by the DPWM signal. The interleaving signals are used as the On/Off signal of the P-type MOS FET cells.

The first and second interleaving signals (not shown) generated by multiplying the first ring counter signals 1000 and second ring counter signals 1002 and 1004 by the inverse signal of the DPWM signal are provided as the On/Off signal of the N-type MOS FET. The first ring counter signals 1000 and second ring counter signals 1002 and 1004 are designed not to overlap with each other in time so that the P-type MOS FET and N-type MOS FET power cells are not turned on and off at the same time. It is possible to block the ground short from the battery power when one P-type MOS FET power cell is turned on and the other N-type MOS FET power cell is turned on. Accordingly, using the present interleaving switching signal, the power cells can be connected to the single inductor without having to attach the inductors to the outputs of the power cells.

The reference signal and the input signal are converted to the DPWM signal through the comparator, the DPWM signal is converted to the interleaving switching signal through the demultiplexer, the interleaving switching signal is input to the P-type MOS FET/N-type MOS FET power cells, and the output signal is produced.

Using the exemplary interleaving switching method, the efficient operating frequency of the buck converter can be increased and the switching frequency for driving the individual power cell of the buck converter can be lowered. Thus, the hybrid power modulator using the exemplary interleaving switching method can attain high efficiency and high linearity even with the envelope signal of the very wide bandwidth as shown in FIG. 11.

Figure 11:
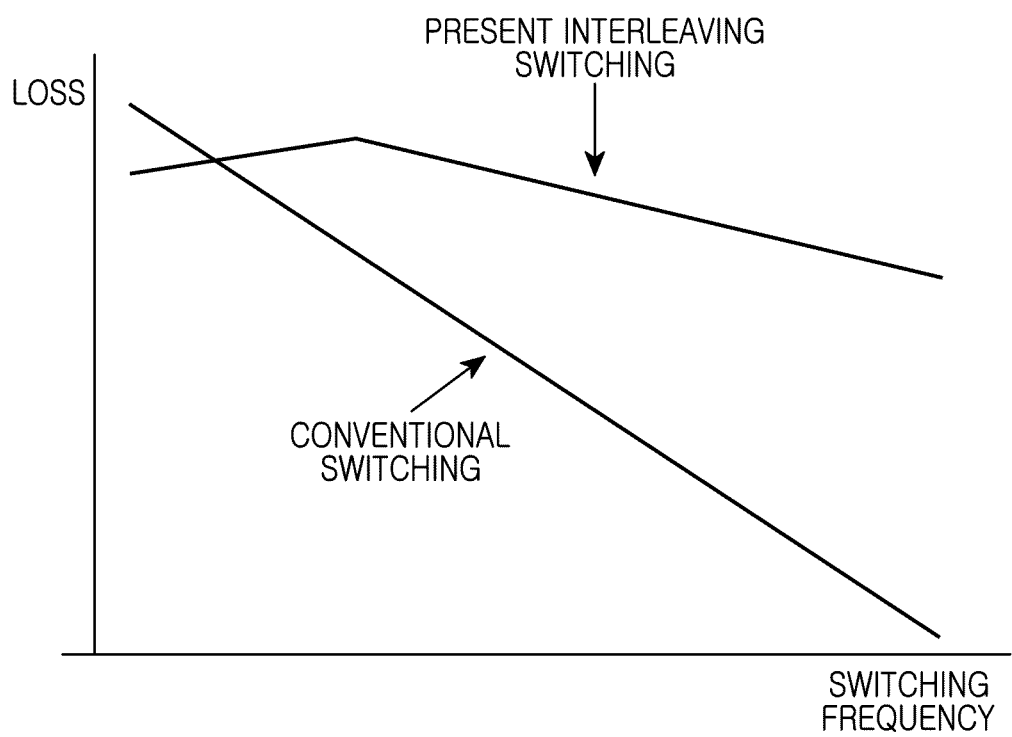
FIG. 11 illustrates a graph of a loss based on a switching frequency of an interleaving switching method according to an exemplary embodiment of the present invention.

FIG. 11 illustrates a graph of a loss based on a switching frequency of an interleaving switching method according to an exemplary embodiment of the present invention.

Referring to FIG. 11, the y axis indicates loss, having its unit represented in the dB scale. 0 dB indicates no loss, and a decibel below 0 dB indicates loss. As the X value, that is, the switching frequency, increases, the loss increases. When the exemplary interleaving switching method is used, the loss reduces compared to the basic switching method.

The present interleaving switching signal blocks the simultaneous on/off of the power cells. Hence, even when the single inductor is used in the buck converter, the exemplary interleaving switching method can be fulfilled. The DPWM signal according to the present interleaving switching signal includes the information of most of the input signal, and the spectrum is substantially the same as the spectrum of the input signal. Hence, the hybrid power modulator can operate in the PWM or hysteretic fashion when the small signal operates. The output signal of the linear amplifier can push or pull the small current for compensating for the ripple noise to or from the output stage. Thus, the relatively low efficiency is attained and the current pushed or discarded by the linear amplifier is reduced to thus improve the efficiency of the hybrid power modulator. The DPWM signal, which has the same in-band spectrum as the input signal and sustains the same spectrum as the output signal, in spite of the leak noise of the pulse signal of the switching amplifying unit, is robust to the leak noise. The PWM or hysteretic scheme of the related art uses the fixed or unpredictable switching frequency, whereas the present interleaving switching signal can control the switching frequency more easily. Therefore, when the channel width varies based on the multiband communication or the user status as shown in FIG. 12, the switching frequency can be controlled adaptively.

Figure 12:
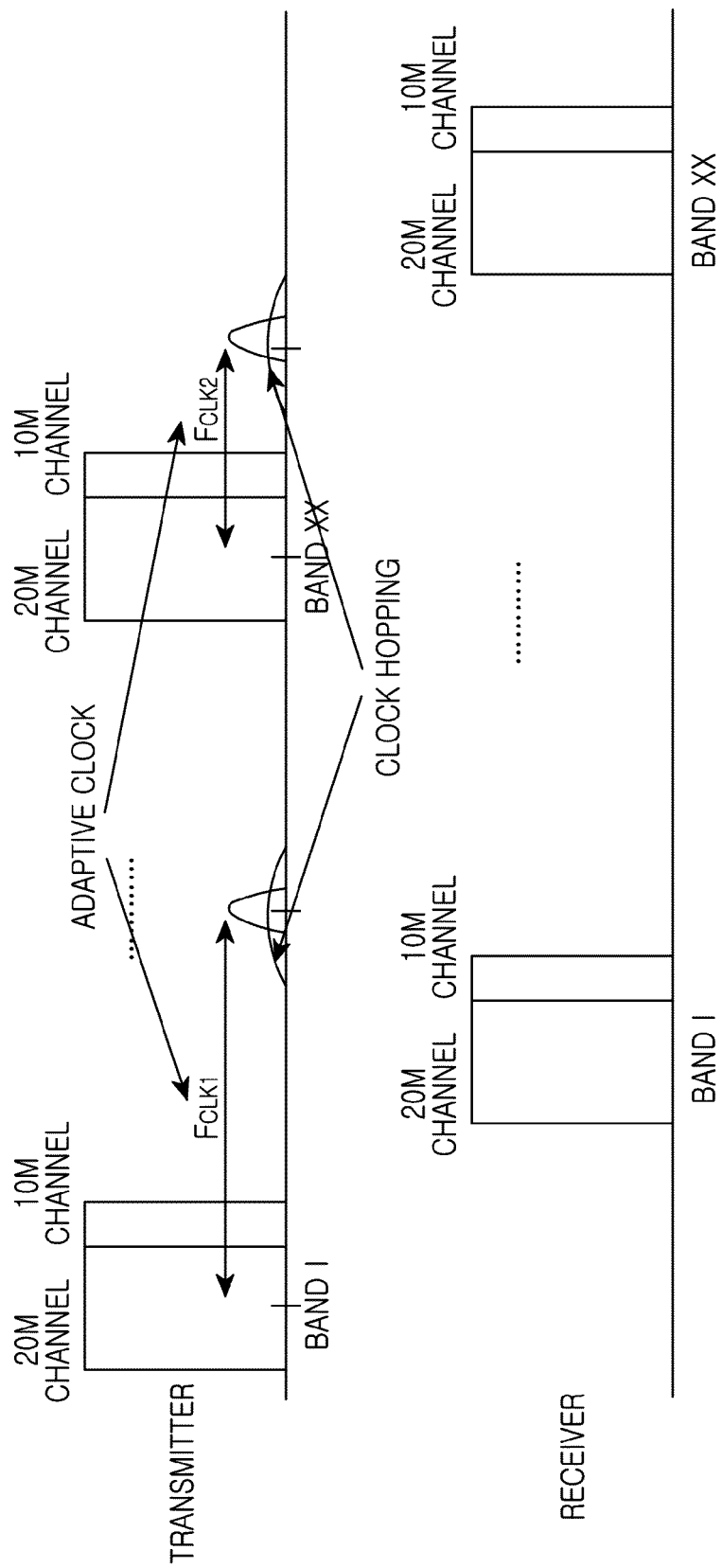
FIG. 12 illustrates an adaptive switching frequency control method based on a multiband or a variable channel according to an exemplary embodiment of the present invention.

FIG. 12 illustrates an adaptive switching frequency control method based on a multiband or a variable channel according to an exemplary embodiment of the present invention.

Figure 13:
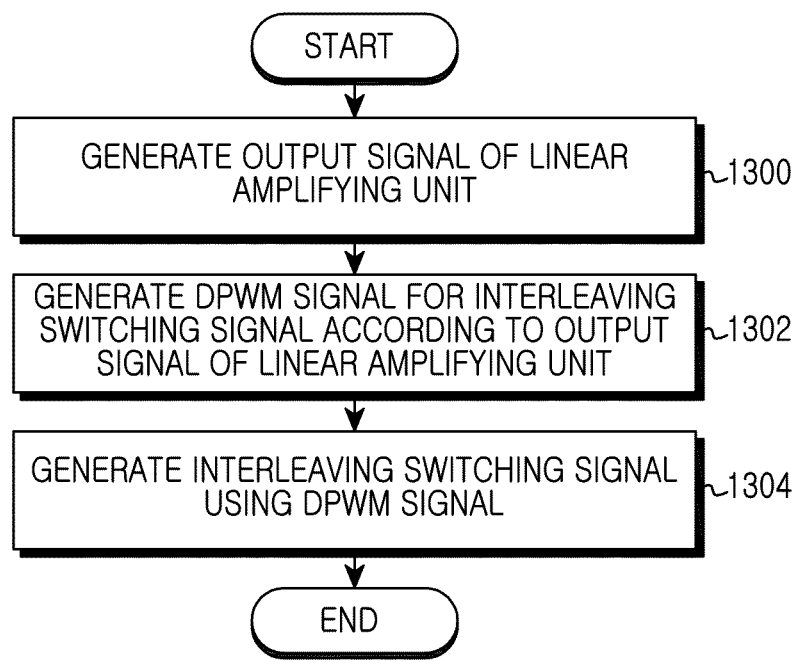
FIG. 13 is a flowchart illustrating a method for generating an interleaving switching signal according to an exemplary embodiment of the present invention.

FIG. 13 is a flowchart illustrating a method for generating an interleaving switching signal according to an exemplary embodiment of the present invention.

Referring to FIG. 13, the linear amplifying unit compares the feedback output signal and the envelope input signal and provides the output signal to the switching amplifying unit in step 1300.

Meanwhile, the linear amplifying unit provides the compensation current to the switching amplifying unit in order to compensate for the linearity distortion according to the ripple of the output signal when the output signal of the switching amplifying unit passes through the inductor. For example, the linear amplifying unit supplies the compensation current when the small current flows in the output signal of the switching amplifying unit, and reduces the flowing current when the considerable current flows in the output signal of the switching amplifying unit.

In step 1302, the switching amplifying unit generates the DPWM signal for the interleaving switching signal according to the output signal from the linear amplifying unit.

For example, the switching amplifying unit generates the DPWM signal by multiplying the output signal, which compares the output signal of the linear amplifying unit with the reference signal (e.g., the digital sawtooth signal), by the ring counter signals (see FIG. 9). The ring counter signals for generating the DPWM signal have the same cycle and the different phases.

In step 1304, the switching amplifying unit generates the interleaving switching signal using the ring counter signals for generating the interleaving switching signal such that the switching signal is not provided to the P-type MOS FET and the N-type MOS FET at the same time, using the generated DPWM signal (see FIG. 10). Thereafter, the switching amplifying unit completes this process.

As set forth above, using the exemplary interleaving switching method, it is possible to attain the high effective operating frequency of the buck converter and the low switching frequency for driving the individual power cell of the buck converter. Thus, the hybrid power modulator using the exemplary interleaving switching method in the envelope signal of the wide bandwidth maintains the high efficiency and the high linearity. In addition, the buck converter can use the single inductor by preventing the simultaneous on/off of the power cells.

The DPWM signal according to the interleaving switching signal includes the information of most of the input signal, and its spectrum is substantially the same as the spectrum of the input signal. Hence, the hybrid power modulator can operate in the PWM fashion or in the hysteretic fashion when the small signal operates. The output signal of the linear amplifier can push or pull the small current for compensating for the ripple noise to or from the output stage. Thus, the current pushed or discarded by the linear amplifier operating with the relatively low efficiency is reduced to thus enhance the efficiency of the hybrid power modulator. Since the DPWM signal, which maintains the same in-band spectrum as the input signal, sustains the same spectrum as the output signal even when the leak noise of the pulse signal of the switching amplifying unit generates, it is robust to the leak noise.

In addition, the interleaving switching signal can control the switching frequency more easily. Therefore, when the channel width varies based on the multiband communication or the user status, the switching frequency can be controlled adaptively.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. An apparatus of a hybrid power modulator using interleaving switching, the apparatus comprising:
   a linear amplifying unit for generating an output signal by comparing an envelope input signal and a feedback signal;
   an interleaving signal generator for generating an interleaving switching signal by comparing the output signal and a reference signal; and
   a switching amplifying unit for determining a level of the switching signal using the interleaving switching signal,
   wherein the switching amplifying unit comprises a plurality of power cells which comprise P-type Metal-Oxide-Semiconductor (MOS) Field Effect Transistors (FETs) and N-type MOS FETs,
   wherein the interleaving switching signal is a switching signal arranged not to supply the signal to input stages of the P-type MOS FETs and the N-type MOS FETs of the power cells at the same time, and
   wherein the interleaving switching signal is used as the on/off signal of the P-type MOSFETs and the N-type MOSFETs.

2. The apparatus of claim 1, wherein the interleaving signal generator comprises:
a plurality of comparators for comparing the output signal and a digital sawtooth signal, which is divided into a plurality of levels during one cycle, and outputting a comparison result;
a plurality of D flip-flops for processing output signals of the comparators according to a master clock; and
a plurality of tri-state buffers for processing the output signals of the comparators, which are synchronized with the master clock, according to a plurality of ring counter clocks,
wherein the output signals of the tri-state buffers are combined to generate a Digital Pulse Width Modulation (DPWM) signal.

3. The apparatus of claim 2, further comprising:
a demultiplexer for generating a pulse signal by multiplying the DPWM signal by a plurality of first inverse ring counter clocks such that the switching signal is not supplied to the input stages of the P-type MOS FETs and the N-type MOS FETs of the switching amplifying unit at the same time.

4. The apparatus of claim 2, wherein the plurality of ring counter clocks have the same cycle and different phases, and the cycle is equal to or slower than a cycle of the digital sawtooth signal.

5. The apparatus of claim 2, wherein a cycle of the digital sawtooth signal, which is divided into the plurality of levels, is more than two times faster than the cycle of the output signal.

6. The apparatus of claim 3, wherein the plurality of first inverse ring counter clocks is determined based on an average duty ratio of the DPWM signal.

7. The apparatus of claim 3, wherein the plurality of first inverse ring counter clocks has different cycles, different phases, and different duty ratios.

8. The apparatus of claim 3, wherein the demultiplexer generates the pulse signal by multiplying an inverse signal of the DPWM signal by a plurality of second inverse ring counter clocks such that the switching signal is not supplied to the input stages of the P-type MOS FETs and the N-type MOS FETs of the switching amplifying unit at the same time.

9. The apparatus of claim 8, wherein the first inverse ring counter clocks and the second inverse ring counter clocks do not overlap each other.

10. A method for hybrid power modulation using interleaving switching, the method comprising:
generating an output signal by comparing an envelope input signal and a feedback signal;
generating an interleaving switching signal by comparing the output signal and a reference signal; and
determining a level of the switching signal using the interleaving switching signal,
wherein a switching amplifying unit comprises a plurality of power cells which comprise P-type Metal-Oxide-Semiconductor (MOS) Field Effect Transistors (FETs) and N-type MOS FETs,
wherein the interleaving switching signal is a switching signal arranged not to supply the signal to input stages of the P-type MOS FETs and the N-type MOS FETs of the power cells at the same time, and
wherein the interleaving switching signal is used as the on/off signal of the P-type MOSFETs and the N-type MOSFETs.

11. The method of claim 10, wherein the generating of the interleaving switching signal by comparing the output signal and the reference signal comprises:
comparing the output signal and a digital sawtooth signal, which is divided into a plurality of levels during one cycle, and outputting a comparison result;
processing the output signals according to a master clock; and
processing the output signals, which are synchronized with the master clock, according to a plurality of ring counter clocks,
wherein the output signals processed according to first ring counter clocks are combined to generate a Digital Pulse Width Modulation (DPWM) signal.

12. The method of claim 11, further comprising:
generating a pulse signal by multiplying the DPWM signal by a plurality of first inverse ring counter clocks such that the switching signal is not supplied to the input stages of the P-type MOS FETs and the N-type MOS FETs of the switching amplifying unit at the same time.

13. The method of claim 11, wherein the plurality of ring counter clocks have the same cycle and different phases, and the cycle is equal to or slower than a cycle of the digital sawtooth signal.

14. The method of claim 12, wherein a cycle of the digital sawtooth signal, which is divided into the plurality of levels, is more than two times faster than the cycle of the output signal.

15. The method of claim 12, wherein the plurality of first inverse ring counter clocks is determined based on an average duty ratio of the DPWM signal.

16. The method of claim 12, wherein the plurality of first inverse ring counter clocks has different cycles, different phases, and different duty ratios.

17. The method of claim 12, further comprising:
generating, at the demultiplexer, the pulse signal by multiplying an inverse signal of the DPWM signal by a plurality of second inverse ring counter clocks such that the switching signal is not supplied to the input stages of the P-type MOS FETs and the N-type MOS FETs of the switching amplifying unit at the same time.

18. The method of claim 17, wherein the first inverse ring counter clocks and the second inverse ring counter clocks do not overlap each other.

19. An apparatus of a transmitter, the apparatus comprising:
a power modulator for generating an interleaving switching signal using a Digital Pulse Width Modulation (DPWM) signal; and
a power amplifier for amplifying a Radio Frequency (RF) signal according to an output signal of the power modulator,
wherein the interleaving switching signal is a switching signal arranged not to supply the signal to input stages of a plurality of power cells which generate a multiphase switching signal, and
wherein the power cell comprises a P-type Metal-Oxide-Semiconductor (MOS) Field Effect Transistor (FET) and an N-type MOS FET.

20. The apparatus of claim 19, wherein the power modulator comprises:
an interleaving signal generator; and
the plurality of power cells,
wherein the interleaving signal generator comprises:
a plurality of comparators for comparing an input signal and a digital sawtooth signal, which is divided into a plurality of levels during one cycle, and outputting a comparison result;
a plurality of D flip-flops for processing output signals of the comparators according to a master clock; and a plurality of tri-state buffers for processing the output signals of the comparators, which are synchronized with the master clock, according to a plurality of ring counter clocks, wherein the output signals of the tri-state buffers are combined to generate a Digital Pulse Width Modulation (DPWM) signal.

21. The apparatus of claim 20, further comprising:
a demultiplexer for generating a pulse signal by multiplying the DPWM signal by a plurality of first inverse ring counter clocks such that the switching signal is not supplied to the input stages of the P-type MOS FETs and the N-type MOS FETs of the switching amplifying unit at the same time.

22. The apparatus of claim 21, wherein the ring counter clocks have the same cycle and different phases, and the cycle is equal to or slower than a cycle of the digital sawtooth signal.

23. The apparatus of claim 21, wherein a cycle of the digital sawtooth signal, which is divided into the plurality of the levels, is more than two times faster than the cycle of the output signal.

24. The apparatus of claim 23, wherein the plurality of first inverse ring counter clocks is determined based on an average duty ratio of the DPWM signal.

25. The apparatus of claim 23, wherein the plurality of first inverse ring counter clocks has different cycles, different phases, and different duty ratios.

26. The apparatus of claim 21, wherein the demultiplexer generates the pulse signal by multiplying an inverse signal of the DPWM signal by a plurality of second inverse ring counter clocks such that the switching signal is not supplied to the input stages of the P-type MOS FETs and the N-type MOS FETs of the switching amplifying unit at the same time.

27. The apparatus of claim 26, wherein the first inverse ring counter clocks and the second inverse ring counter clocks do not overlap each other.

* * * * *